United States Patent

Jaussaud et al.

(10) Patent No.: US 7,368,030 B2
(45) Date of Patent: May 6, 2008

(54) INTERMEDIATE SUCTION SUPPORT AND ITS UTILISATION FOR PRODUCING A THIN FILM STRUCTURE

(75) Inventors: Claude Jaussaud, Meylan (FR); Michel Bruel, Veurey (FR); Bernard Aspar, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 445 days.

(21) Appl. No.: 11/191,290

(22) Filed: Jul. 27, 2005

(65) Prior Publication Data

US 2005/0270867 A1 Dec. 8, 2005

Related U.S. Application Data

(62) Division of application No. 10/149,316, filed as application No. PCT/FR00/03482 on Dec. 12, 2000, now abandoned.

(30) Foreign Application Priority Data

Dec. 13, 1999 (FR) .................................. 99 15667

(51) Int. Cl.
*B32B 37/10* (2006.01)
(52) U.S. Cl. ...................... 156/241; 156/230; 156/344; 156/584; 438/458
(58) Field of Classification Search ................ 156/230, 156/241, 344, 584; 438/458
See application file for complete search history.

(56) References Cited

U.S. PATENT DOCUMENTS

| 4,049,484 A | 9/1977 | Priest et al. |
| 4,521,995 A | 6/1985 | Sekiya |
| 4,597,228 A | 7/1986 | Koyama et al. |
| 4,906,011 A | 3/1990 | Hiyamizue et al. |
| 5,141,212 A | 8/1992 | Beeding |
| 5,447,596 A * | 9/1995 | Hayase ....................... 156/584 |
| 5,563,683 A | 10/1996 | Kamiya ....................... 355/53 |
| 5,695,600 A | 12/1997 | Goin |
| 5,811,348 A | 9/1998 | Matsushita et al. ......... 438/455 |
| 6,020,252 A * | 2/2000 | Aspar et al. ................ 438/458 |
| 6,173,948 B1 | 1/2001 | Hall et al. |
| 6,484,393 B1 | 11/2002 | Chan |
| 6,521,078 B2 * | 2/2003 | Yanagita et al. ............ 156/344 |
| 7,118,990 B1 * | 10/2006 | Xu et al. .................... 438/455 |

FOREIGN PATENT DOCUMENTS

| DE | 44 46 546 A1 | 6/1996 |
| EP | 0 415 340 A1 | 8/1990 |
| EP | 0 533 551 A1 | 9/1992 |
| EP | 0 595 071 A1 | 10/1993 |
| EP | 0 645 828 A1 | 9/1994 |
| EP | 0 797 258 A2 | 3/1997 |
| JP | 09/331077 | 12/1997 |

* cited by examiner

*Primary Examiner*—Mark A Osele
(74) *Attorney, Agent, or Firm*—Thelen Reid Brown Raysman & Steiner LLP

(57) ABSTRACT

The present invention relates to an intermediate suction support. The support has at least one suction surface (62) intended to receive a first face of at least one substrate comprising an embrittled layer, a film thus being defined between the first face of the substrate and the embrittled layer, the suction surface (62) of the intermediate support being the face with at least one suction element (63) comprising suction means provided so that, when the embrittled layer is submitted to a treatment leading to the separation of the film from the rest of the substrate, the film can be recuperated.

Application to the production of a thin film structure.

11 Claims, 3 Drawing Sheets

INTERMEDIATE SUCTION SUPPORT AND ITS UTILISATION FOR PRODUCING A THIN FILM STRUCTURE

CROSS-REFERENCE TO RELATED APPLICATION

This application is a divisional of co-pending U.S. Pat. application Ser. No. 10/149,316, entitled "Intermediate Suction Support And Its Utilisation For Producing A Thin Film Structure" by inventor Claude Jaussaud, Michel Bruel and Bernard Aspar, filed on Sep. 17, 2002 now abandoned, which claims priority of PCT international application no. PCT/FR00/03482, filed on Dec. 12, 2000.

TECHNICAL FIELD

The present invention relates to an intermediate suction support and its utilisation for producing a thin film structure.

STATE OF PRIOR ART

The introduction of gaseous species into a solid material can be carried out advantageously by ionic implantation. Thus, the document FR-A-2 681 472 (corresponding to the American Pat. No. 5,374,569) describes a method for manufacturing thin films of semiconductor material. This document reveals that the implantation of a rare gas or hydrogen in a substrate in a semiconductor material is capable of inducing, under certain conditions, the formation of micro-cavities or platelets (micro-bubbles) at a depth close to the average depth of penetration of the implanted ions. If this substrate is put into intimate contact, on its implanted face, with a stiffener and a heat treatment is applied at a suitable temperature, there is interaction between the micro-cavities or platelets resulting in separation of the semiconductor substrate into two parts: a thin semiconductor film adhering to the stiffener on the one hand, and the remainder of the semiconductor substrate on the other hand. The separation takes place at the level of the zone where the micro-cavities or platelets are present. The heat treatment is such that the interaction between the platelets or micro-cavities created by implantation is capable of inducing separation between the thin film and the rest of the substrate. Thus, one can transfer a thin film from an initial substrate to a stiffener acting as support for this thin film.

If the thin film is sufficiently thick to be carried on its own, it can be separated by fracture at the level of the embrittled zone, from the remainder of its substrate, without any support. On the other hand, in the contrary case, the separation by fracture of the thin film requires the utilisation of a support or stiffener which allows both the grasp of the film and enables fracture, avoiding the appearance of any blisters on the surface of the film.

At present, the stiffeners used are integral with the thin film, either by depositing a suitable layer, or by transferring a support and sticking by molecular adhesion or by an appropriate glue. However, the present solution which consists of using sticking by molecular adhesion requires a surface preparation which can be delicate and costly. Furthermore, gluing a support with glue does not allow later high temperature operations on the thin film, in particular because of the temperature hold limit of organic glues, and the restrictions involved in high temperature operations and contaminations in the case of inorganic glues.

Furthermore, at present photovoltaic cells are produced either from monocrystalline semiconducting material with large grains (1 mm) or from amorphous or polycrystalline semiconducting material with small grains (of the order of 1 µm). Examples of monocrystalline materials are silicon, GaAs and in general substances of the III-V type. As large grain polycrystalline material one can cite silicon. Examples of amorphous or polycrystalline materials are amorphous silicon or compound materials such as CdTe or CIS (Copper-Indium-Selenium).

Solid monocrystalline or polycrystalline materials are expensive and one tries to reduce their thickness in order to lower the costs. At present, for silicon, thicknesses are typically between 200 and 300 µm and the aim is to reduce them to 100 µm. Below a thickness of 100 µm, it becomes very difficult to manipulate large surface films used for producing cells (>100 cm$^2$).

Polycrystalline or amorphous materials have lower conversion yields than monocrystalline materials. For example, for single-crystal silicon the best yields obtained are 24.80 whereas the best yields obtained with amorphous silicon are only 12.70.

An especially interesting solution would be to use several thin films (of several µm to several tens of µm) of monocrystalline or polycrystalline semiconducting material on a substrate of large size and low cost such as glass or ceramic. However, at present it is not known how to produce this type of structure at a cost compatible with the cost of photovoltaic cells.

Several methods have been proposed for producing thin films or structures in single crystal silicon to manufacture solar cells. Three of these are mentioned below.

The article "Thin-film crystalline silicon solar cells obtained by separation of a porous silicon sacrificial layer" by H. TAYANAKA et al., published in the 2nd World Conference and Exhibition on Photovoltaic solar Energy Conversion, 6-10 Jul. 1998, Vienna (Austria), pages 1272-1277, reveals a solution implementing the following structure: substrate of silicon—layers of porous silicon—layer of epitaxial single-crystal silicon. The solar cells are produced in an epitaxial layer which is then glued to a film of transparent plastic. The substrate is then separated at the level of the sacrificial layers of porous silicon by applying mechanical forces. This method has several disadvantages: consumption of silicon (the porous layers are sacrificed), the porous layers are formed in several stages in order to obtain three different porosities, and the method is certainly difficult to industrialise.

The article "Waffle cells fabricated by the perforated silicon (Ψ) process" by R. BRENDEL, published in the work quoted above, pages 1242-1247, reveals a solution using a deposit of porous, silicon on a textured silicon substrate. A silicon layer is then epitaxied on the porous silicon. The epitaxial film is separated from the substrate by applying mechanical forces. This solution is very close to that described in the preceding article and has the same disadvantages.

The article "Characterisation of silicon epitaxial layers for solar cell applications" by K. R. CATCHPOLE et al., also appearing in the work quoted above, pages 1336-1339, reveals a solution implementing an epitaxy in liquid phase on a silicon substrate on which an oxide mask with motives has been deposited. The silicon only epitaxies on the zones not covered with oxide, which results in epitaxial strips with the shape of a lozenge, when seen in cross-section. The epitaxial layer is then detached from its support by selective chemical dissolving of the most highly doped zones at the epitaxied substrate-layer interface. This solution certainly poses the problem of re-using the substrate a large number of times.

These three articles do not mention the transfer of films or structures onto a large-size support for collective production of cells. They refer to technologies that are often delicate to implement.

DESCRIPTION OF THE INVENTION

The present invention makes it possible to compensate for the disadvantages of prior art. It makes it possible to obtain a structure comprising thin films deposited on a low cost substrate (for example glass, ceramic or plastic). It enables the consumption of semiconducting material to be reduced to the minimum. It is simple to implement and to industrialise. It allows the substrate providing the thin films to be reused many times. It enables collective production of photovoltaic cells.

A first aim of the invention consists of an intermediate suction support, characterised in that it has at least one suction surface intended to receive a first face of at least one substrate comprising an embrittled layer, a film then being defined between the first face of the substrate and the embrittled layer, the suction surface of the intermediate support being the face with at least one suction element comprising suction means provided so that, when the embrittled layer is submitted to a treatment leading to the separation of the film from the rest of the substrate, the film can be recuperated.

An embrittled layer can be a porous layer or a layer in which gaseous species have been implanted. The separation treatment (which can be a combination of various treatments) can in particular be a heat treatment or a mechanical treatment.

The support according to the invention makes it possible to avoid the formation of blisters and therefore to avoid recuperating the film in the form of chips. The suction support according to the invention thus plays a role of maintenance and of stiffener, and furthermore aids separation, for example by applying stresses in certain cases at the level of the embrittled layer.

The suction element can be made of porous material, the pores of this element constituting the suction means.

It can be pierced with micro-holes, the micro-holes constituting the suction means, the arrangement of the holes and their sizes being planned for recuperating the film.

According to another embodiment, the intermediate suction support comprises a wall pierced with holes, this wall carrying at least one suction element, the arrangement and the size of the holes in the wall being planned in function of the suction means of said suction element so that the suction element can enable recuperation of the film.

According to a variant, the contact between the plate and the support is obtained by suction and, if the surface condition is suitable, by molecular adhesion with controlled sticking forces.

According to a further embodiment of the invention, the intermediate suction support comprises a wall pierced with holes, this wall supporting a plate also pierced with holes, the plate carrying several suction elements, the arrangement and the size of the holes of the elements being planned to allow recuperation of the film.

The suction surface can have a dished shape, convex or concave, making it possible to produce a mechanical stress on the film during its separation from the rest of the substrate. These shapes facilitate separation.

The face of the suction element can be a face allowing molecular adherence with said first face of the substrate.

A second aim of the invention consists of a method for producing a thin film structure, comprising the transfer of at least one film onto a support called a definitive support by means of an intermediate support, characterised in that it comprises the following stages:

formation of an embrittled layer embedded in a substrate, a film thus being defined between the first face of the substrate and the embrittled layer, contact between the first face of the substrate and a suction surface of the intermediate support, the suction surface being the face of a suction element comprising suction means provided so that, when the embrittled layer is submitted to a treatment leading to the separation of the film from the rest of the substrate, the film can be recuperated, submission of said embrittled layer to said separation treatment, the first face of the substrate being integral with the intermediate support through suction, transfer of the film obtained onto the definitive support, withdrawal of the intermediate support by stopping the suction.

The contact between the first face of the substrate and the suction surface of the intermediate support can be strengthened by molecular adherence. This adherence can be controlled by appropriate treatment to allow sticking reversibility.

The definitive support can support the film by means of sticking through molecular adherence or by gluing with an adhesive material. The adhesive material can be a creep material set on the definitive support and/or on the thin film.

Since the structure is a structure comprising thin film photovoltaic cells, the method may comprise transferring mono-layer or multi-layer semiconducting films to form a surfacing on the definitive support and the treatment of these films in order to obtain photovoltaic cells from these films.

Before transfer, these films can be partially or totally treated in order to obtain said photovoltaic cells. They can also, after transfer, be treated with a view to obtaining said photovoltaic cells.

The transfer of the films can be made on a support in a material chosen from amongst glass, ceramic and plastic. It can be made with a surfacing of a shape chosen from amongst rectangular, hexagonal and circular shapes. The transferred films can be semiconducting material films chosen from amongst monocrystalline and polycrystalline materials with large grains.

BRIEF DESCRIPTION OF THE FIGURES

The invention will be better understood and other advantages and specialities will become clearer by reading the following description, given as a non-limiting example, accompanied by drawings in which.

DETAILED DESCRIPTION OF THE EMBODIMENTS ACCORDING TO THE INVENTION

The invention will now be described taking as example the embodiment of a structure comprising thin film photovoltaic cells on a support.

Figure 1A:
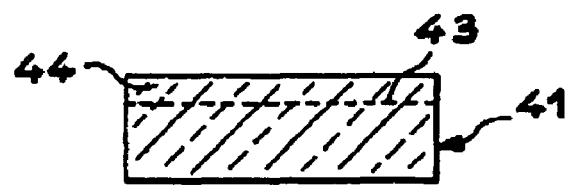
FIGS. 1A to 1F show the production of a structure comprising thin film photovoltaic cells on a support, according to the present invention.

FIG. 1A shows a silicon substrate 41 in which a film 44 has been defined by an embedded fragile layer containing microcavities 43 obtained by ion implantation. The implantation can take place on a bare substrate, which has possibly already undergone technological operations, or with surface texturing. The implantation can also take place through a layer (oxide or nitride for example), deposited on the substrate. The implanted substrates can also undergo technological operations. These operations can have an impact on the fracture conditions, in particular an epitaxy intended to increase the thickness of the silicon film. The embrittlement operations through ion implantation must be made compatible with the technological operations. This subject can be consulted by referring to document FR-A-2 748 851.

Figure 1B:
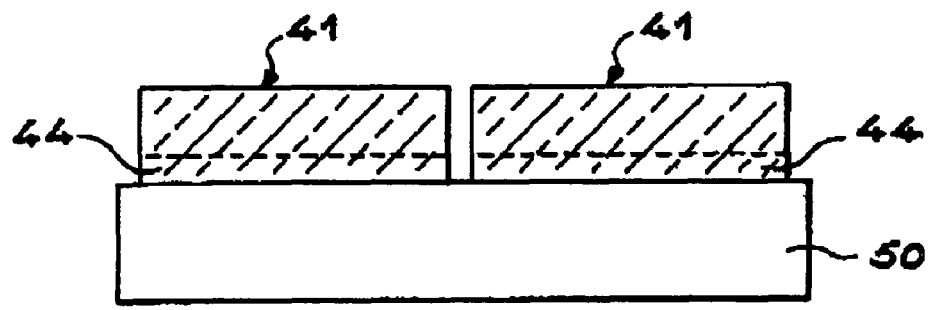

FIG. 1B shows two substrates 41 set on a suction support 50 on their film side 44.

Figure 1C:
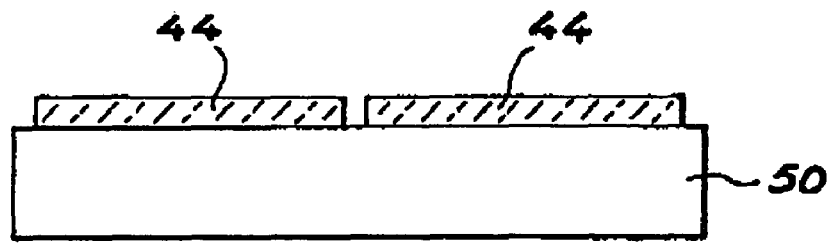

FIG. 1C shows the result obtained after separation of the films 44 from their substrates, the separation being, for example, obtained by heat treatment.

Figure 1D:
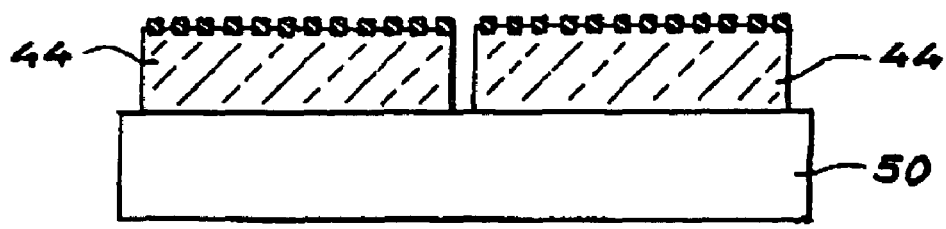

An epitaxy can then be carried out from the free faces of the films 44 and one can proceed to various technological operations to obtain the result shown in FIG. 1D. These operations can comprise the production of N and P contacts with their associated doping (or regions).

Figure 1E:
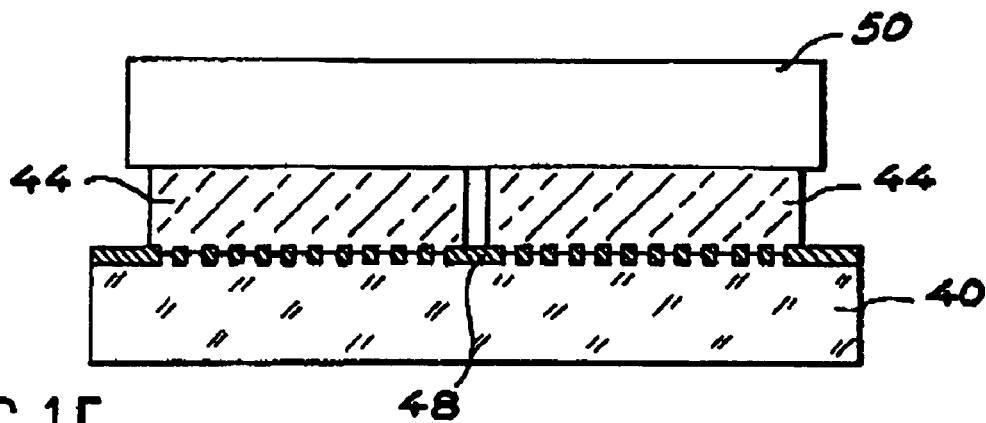

The free faces of the films 44, still maintained on their suction support 50, are then stuck on the definitive support 40 which, for example, comprises interconnections 48 between cells (see FIG. 1E). The definitive support 40 can be in glass, ceramic, or plastic. Depending on the nature of this definitive support, the sticking can be achieved through the intermediary of metallic layers, through the intermediary of a layer of glass or cold flow oxide or an adhesive substance.

The intermediate support is withdrawn by stopping the depression and then, possibly, by a slight repressure allowing easier separation of the intermediate support from the films.

Figure 1F:
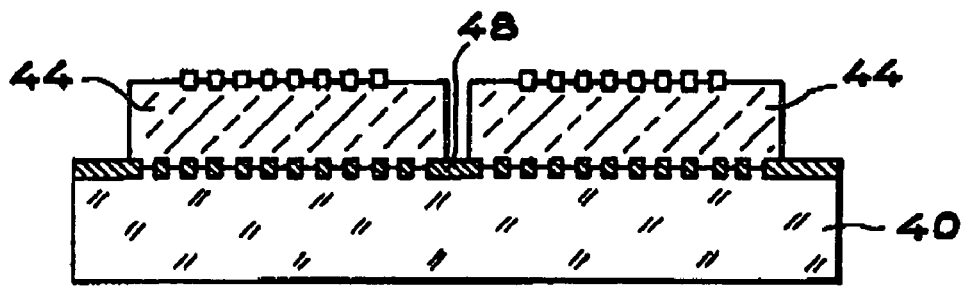

As shown in FIG. 1F, the withdrawal of the intermediate support makes it possible to obtain, in a collective manner, the structural cells (production of connections etc.).

Generally speaking, the thickness of the semiconducting films can be increased, after transfer onto a support, by epitaxy. If the support can be raised to a sufficient temperature for epitaxy, this can be carried out in the normal way in vapour or liquid phase. If the support cannot be raised to high temperature (the case of silicon on a glass support or of a technology only partly developed), the thickness of the silicon film can be increased by making a deposit of polycrystalline or amorphous silicon at low temperature and re-crystallising this film by laser heat treatment (fusion of this deposited layer and a part of the thin film of single crystal silicon, so as to obtain an epitaxy when cooled).

The technology for producing the cells can be classic (heat treatment in a furnace) if the substrates and the sticking mode chosen can withstand high temperatures. If this is not the case (in particular if the final support is glass or if gluing with materials not able to withstand high temperatures is used), heat treatments (epitaxy, diffusion doping, annealing etc.) can be carried out with a laser beam, which makes it possible to heat the thin surface film (up to liquefaction if necessary), without heating the glass.

The suction support can comprise a plate pierced with many small diameter holes or a plate of porous material. The thin films, set on the front face of the plate, are maintained there creating a depression on the rear face of the plate.

Figure 2:
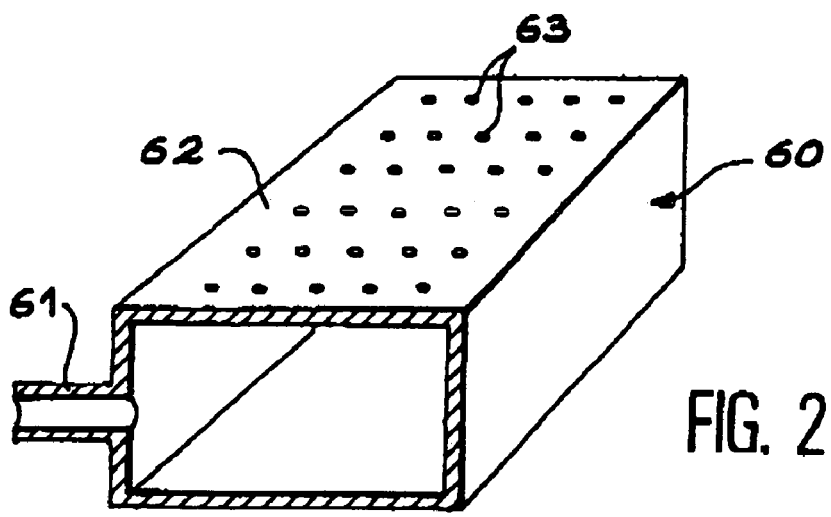
FIG. 2 shows a first intermediate support according to the invention capable of supporting thin films by depression.

FIG. 2 is a cross-section of a first intermediate support able to support thin films by depression. It is constituted of a chamber 60 whose interior can be connected to a depression device by means of a neck 61. The chamber 60 has a plane wall 62, pierced with small diameter holes or microholes 63.

The size and distancing of the micro-holes are determined by the rigidity of the thin films to be manipulated. The micro-holes must be smaller and closer when the films are less rigid. Accordingly, the surface state of the wall 62 must be better when the rigidity of the film is weaker.

Figure 3:
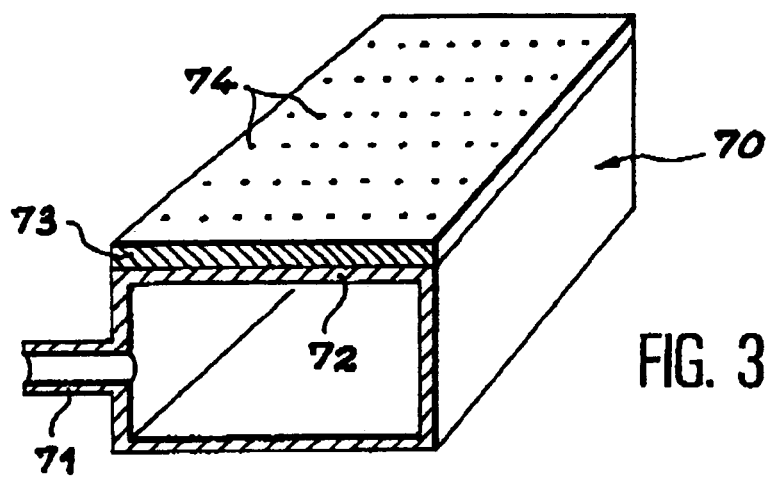
FIG. 3 shows a second intermediate support according to the invention capable of supporting thin films by depression.

FIG. 3 is a cross-section of a second intermediate support capable of supporting thin films by depression. Just like the intermediate support of FIG. 2, it comprises a chamber 70 with a neck 71. The chamber 70 also has a plane wall 72 pierced with holes and supporting a flat plate 73 pierced with micro-holes 74. The plate 73 is fixed to the wall 72 by elements not shown, and not disturbing its operations. The distribution and the size of the holes in the wall 72 and the distribution and the size of the micro-holes in the plate 73 are such that the plate 73 provides an active surface with uniform suction. This configuration makes it possible to use a suitable pierced plate, for example with the possibility of making micro-holes through a collective method and/or in a material adapted to the thermal expansion coefficient of the thin films.

Figure 4:
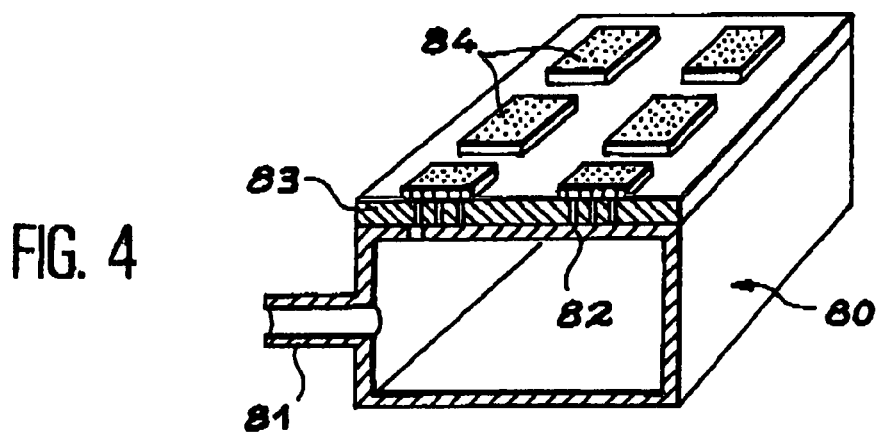
FIG. 4 shows a third intermediate support according to the invention capable of supporting thin films by depression.

FIG. 4 is a cross-section of a third intermediate support capable of supporting thin films by depression. As for the support of FIG. 3, a chamber 80 can be seen, provided with a neck 81. The chamber 80 also has a plane wall 82 pierced with holes and supporting a plane support 83 pierced with smaller diameter holes. The plane plate 83 in its turn supports flat plates 84 pierced with micro-holes. The diameters of the holes and their spacing in the wall 82, the plate 83 and the parts 84 are such that the parts 84 each provide a uniform suction surface. This configuration has the advantage of being much easier to produce and to use. In fact, the parts 84 can be made from the same material as that constituting the films to be transferred. Thus all problems linked to differential dilatation during heat treatment are avoided. For example, they can be in silicon if the thin films are in silicon. Furthermore, the production of small dimension parts in silicon is easier than the production of a large dimension silicon plate.

Figure 5:
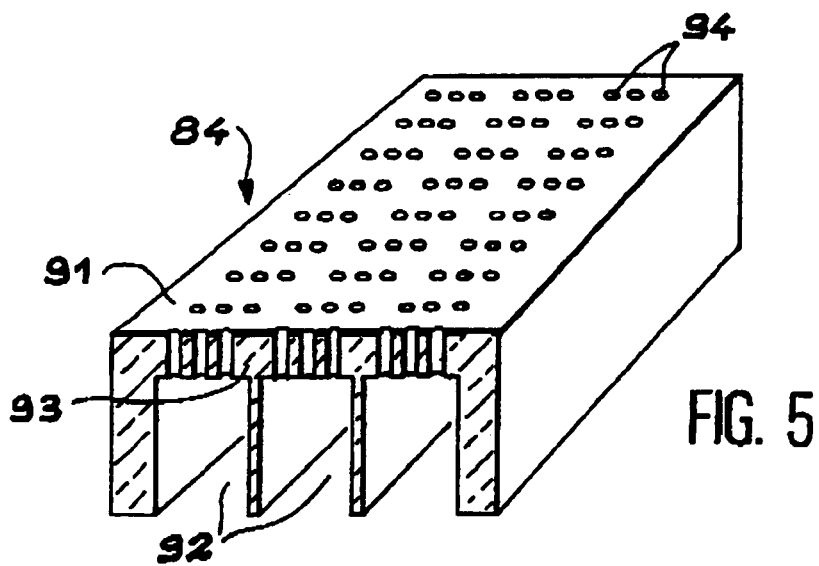
FIG. 5 shows, in detail, an intermediate support element according to the invention capable of supporting thin films by depression.

FIG. 5 is a view in perspective of an example of a part with reference number 84 in FIG. 4. This part is so-called flat in the meaning that it offers, on the front face, a flat surface 91 for the film to be supported.

A part 84 in silicon can be obtained by engraving a plate of silicon 500 μm in thickness. Longitudinal cavities 92 of 1 mm width and 450 μm depth are engraved from the rear face of the plate. On the front face, a thin wall 93 remains, of 50 μm thickness, in which holes 94 of 20 μm diameter are made and spaced, for example, by 100 μm. The holes 94 can also have a diameter of 5 μm and be spaced by 20 μm, A film of 1 μm thickness can be maintained on such a part without breaking and with very little deformation.

The thin wall 93 can be replaced by a porous film produced, for example, by anode oxidation of silicon. The thickness of this porous film can typically be 10 μm.

The invention claimed is:

1. Method for producing a thin film structure, comprising the transfer of at least one film on a support called the definitive support by means of an intermediate support, the method comprising the following stages:
- formation of an embrittled embedded layer in a substrate, a film thus being defined between the first face of the substrate and the embrittled layer,
- contact between the first face of the substrate and a suction surface of the intermediate support, the suction surface being the face of a suction element
- comprising suction means provided so that, when the embrittled layer is submitted to a treatment leading to the separation of the film from the rest of the substrate, the film can be recuperated,
- submission of said embrittled layer to said separation treatment, the first face of the substrate
- being integral with the intermediate support through suction,
- transfer of the film obtained onto the definitive support,
- withdrawal of the intermediate support by stopping the suction.

2. Method according to claim 1, in which said contact of the first face of the substrate with the suction surface of the intermediate support is reinforced by molecular adherence.

3. Method according to claim 1, in which the definitive support supports the film by means of sticking by molecular adherence.

4. Method according to claim 1, in which the definitive support supports the film by means of gluing with an adhesive material.

5. Method according to claim 4, in which said adhesive material is a creep material set on the definitive support and/or the thin film.

6. Method according to claim 1 in which, the structure being a structure comprising thin film photovoltaic cells, the method comprises the transfer of mono-layer or multi-layer semiconductor films to form a surfacing on the definitive support and the treatment of these films to obtain photovoltaic cells from these films.

7. Method according to claim 6, in which the films are, before transfer, partly or totally treated with a view to obtaining said photovoltaic cells.

8. Method according to claim 6 in which, after transfer, the thin films are treated with a view to obtaining said photovoltaic cells.

9. Method according to claim 6, in which the transfer of the thin films is made onto a support in a material chosen amongst glass, ceramic or plastic.

10. Method according to claim 6, in which the transfer takes place according to a surfacing having a shape chosen from amongst rectangular, hexagonal and circular shapes.

11. Method according to claim 6, in which the transferred films are films of semiconducting material chosen among the monocrystalline and polycrystalline materials with large grains.

* * * * *